United States Patent
Park

(10) Patent No.: US 8,046,723 B2
(45) Date of Patent: Oct. 25, 2011

(54) METHOD FOR CORRECTING LAYOUT WITH PITCH CHANGE SECTION

(75) Inventor: Chan Ha Park, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 378 days.

(21) Appl. No.: 12/341,980

(22) Filed: Dec. 22, 2008

(65) Prior Publication Data
US 2009/0319970 A1 Dec. 24, 2009

(30) Foreign Application Priority Data
Jun. 20, 2008 (KR) .................. 10-2008-0058486

(51) Int. Cl.
G06F 9/455 (2006.01)
(52) U.S. Cl. .......... 716/106; 716/51; 716/132; 716/111; 716/55; 716/53
(58) Field of Classification Search .................. 716/104, 716/139, 119, 55, 126, 50, 53, 132, 106
See application file for complete search history.

(56) References Cited

U.S. PATENT DOCUMENTS

| | | | |
|---|---|---|---|
| 6,539,521 | B1 | 3/2003 | Pierrat et al. |
| 7,131,101 | B2 | 10/2006 | Pierrat et al. |
| 7,571,417 | B2 * | 8/2009 | Izuha et al. ............ 716/53 |
| 2004/0257568 | A1 | 12/2004 | Yamane .............. 356/394 |
| 2007/0074145 | A1 * | 3/2007 | Tanaka ............... 716/21 |
| 2008/0003510 | A1 * | 1/2008 | Harazaki ............ 430/5 |
| 2008/0276215 | A1 * | 11/2008 | Higuchi et al. ......... 716/20 |

FOREIGN PATENT DOCUMENTS

| | | |
|---|---|---|
| JP | 2005-037367 | 2/2005 |
| KR | 10-2003-0077446 | 10/2003 |
| KR | 10-2004-0026123 | 3/2004 |
| KR | 10-2006-0131860 | 12/2006 |

* cited by examiner

*Primary Examiner* — Nghia Doan
*Assistant Examiner* — Brian Ngo
(74) *Attorney, Agent, or Firm* — Marshall, Gerstein & Borun LLP

(57) ABSTRACT

A method for correcting a layout with a pitch change section may include disposing a pattern layout with the pitch change section having a first pattern and a second pattern at a pitch relatively larger than that of the first pattern, measuring the pitch change from the pattern layout, a step of measuring an aerial image intensity by performing a simulation operation on the area with the pitch change section; modifying the pitch of the layout in the pitch change section based on a threshold intensity value at which the pattern is formed; and processing the layout correction to cause the pitch to exist within the threshold range by comparing the image intensity of the modified layout with the image intensity of the reference area.

10 Claims, 13 Drawing Sheets

METHOD FOR CORRECTING LAYOUT WITH PITCH CHANGE SECTION

CROSS-REFERENCE TO RELATED APPLICATIONS

The present application claims priority to Korean patent application number 10-2008-0058486, filed on Jun. 20, 2008, which is incorporated by reference in its entirety.

BACKGROUND OF THE INVENTION

The present invention relates to a semiconductor device, and more particularly, to a method for correcting a layout with a pitch change section.

A nonvolatile memory device applies a line-and-space type layout frequently as compared with a Dynamic Random Access Memory device or a logic circuit. In order to perform a pattern transfer of such line-and-space type layout to a wafer more sophisticatedly, it is intended to implement a higher resolution using an asymmetrical illumination system such as a dipole illumination system. Though the line-and-space type layout can be designed to have an equal pitch, it can be designed by applying two different pitches for two different circuit areas. In such a case, the pitch of the line-and-space pattern can be changed in the boundary area of the different pitch areas.

In a section where the pattern pitch is changed in the layout, the line-and-space pattern is designed to be extended successively from an area at which relatively smaller pitch is applied to another area at which relatively bigger pitch is applied. For example, the flash element can be configured with a memory cell area and a page buffer area adjacent to it, and signal lines extended across these two areas, i.e., bit lines are formed with the line-and-space pattern. At this time, the pitch of the signal line in the memory cell area and the pitch of the signal line in the page buffer area are set different from each other. In the page buffer area, since the signal lines as well as high voltage NMOS contact must be disposed between the signal lines, the pitch of the signal lines in the page buffer area is disposed so that it will be changed to be larger. Consequently, the layout of signal line in the boundary area of the page buffer area and the cell area is designed to have a curvature or is connected to have different line width so that the layout is changed to have a step shape. Therefore, such boundary area can be set as a section at where the pitch of the signal line is changed, i.e., a pitch change section.

FIG. 1 and FIG. 2 are drawings showing a pitch change section of a pattern. FIG. 3a and FIG. 3b are drawings showing a layout and reticle which performs an optical proximity correction (OPC) on the pitch change section of FIG. 2.

Upon forming the pattern of the nonvolatile memory device, it is preferable to structure the layout in such a manner that a uniform pitch is successive without changing the pitch of the pattern. When applying the layout in which the pitch of the pattern does not change, it is possible to easily and correctly form a desired pattern on the wafer. However, when inserting a circuit such as a high voltage NMOS contact into a circuit necessary to operate the device, e.g., page buffer area, the layout is inevitably configured with the pitch change section at which different line widths are included. When processing the exposure operation by applying such layout and asymmetric illumination system, a contrast is reduced in the pitch change section 100, 105 and at the same time a defect such as a bridge or a pinching can be caused, as shown in FIG. 1 and FIG. 2. Such defect is considered to be caused due to the resolution reduction and an aerial image intensity discontinuity as different diffraction information is overlapped in the pitch change section.

Consequently, the optical proximity correct (OPC) is processed in order to overcome the patterning defect induced in the pitch change section. The OPC is the process of changing the layout of the problematic section considering the optical proximity effect. Referring to FIG. 2 and FIG. 3a, the OPC is processed in a manner that a shape of the layout is modified considering the optical proximity effect on the layout of the pitch change section 105 at which the defect is generated. However, the OPC has a problem in that the shape of the layout is complicated while reflecting the optical proximity effect on the layout. Referring to FIG. 3b showing the pattern on the reticle with the layout (FIG. 3a) on which the OPC is performed, it will be appreciated that the layout of the pitch change section 105 is complicatedly formed. Since the layout on which the OPC is performed is formed with a complicated profile, a mask writing equipment cannot assure a fidelity of the design layout. Further, it can be implemented differently from design intention in accordance with a state of the mask writing equipment or a fracturing state. As well, since an operation of modifying the layout of the pitch change section is dependent on manual operation by an operator, there is a disadvantage in that it takes much time and effort and it is difficult to ensure a stability on the process.

SUMMARY OF THE INVENTION

A method for correcting a layout with a pitch change section according to one embodiment of the present invention may include preparing a pattern layout disposed to cause line-and-space type first patterns disposed at a first pitch and line-and-space type second patterns disposed at a second pitch to be connected respectively in a pitch change section; obtaining a profile distribution data of a pattern image by performing a pattern transfer simulation on the pattern layout; extracting the profile distribution of the pattern image for the first pattern at any one measuring point within the pitch change section and another reference point outside of the pitch change section from the profile distribution data of the pattern image; extracting a difference between the profile distribution at the measuring point and the profile distribution at the reference point; modifying the pattern layout by adding and reducing a line width of a space part of the first pattern within the pitch change section to compensate the difference between the profile distributions; extracting the profile distribution of the pattern image for the first pattern part in which the line width is changed by performing a second pattern transfer simulation on the modified pattern layout; and determining whether an additional line-width correction of the first pattern part is performed or not by confirming whether the profile distribution of the pattern image for the extracted first pattern part exists within an allowable range.

Preferably, the reference point is set to be located in the first pattern part of a point separated from the second pattern not to be influenced by diffraction phenomenon of an exposure light source due to the second pattern.

Preferably, the reference point is set as a point separated by at least 5 times a size of the pitch from the pitch change section while being in an area of smaller pitch among the first pattern and the second pattern.

Preferably, the profile distribution data of the pattern image includes a pitch change section obtained from the profile distribution of the image for the resist pattern as a simulation result of the pattern transfer.

Preferably, the profile distribution data of the pattern image includes a pitch change section obtained from the intensity profile distribution of an aerial image as a simulation result of the pattern transfer.

Preferably, modifying the pattern layout includes partially chopping the line part of the first pattern in a polygon shape to cause a line width of a space part of the first pattern to be increased if a height of the intensity profile distribution of the aerial image at the measuring point is lower than a height of the profile distribution at the reference point; and adding the line part of the first pattern in the polygon shape to cause the line width of the space part of the first pattern to be reduced if a height of the intensity profile distribution of the aerial image at the measuring point is greater than a height of the profile distribution at the reference point.

Preferably, modifying a pitch of the layout includes chopping the line part of the first pattern connected to the line part of the second pattern to be separated from the line part of the second pattern if a height of the intensity profile distribution of the aerial image at the measuring point is lower than a height of the profile distribution at the reference point.

Preferably, determining whether the additional line-width connection of the first pattern part is performed or not includes setting a threshold intensity value at which a bridge occurs in the first pattern as a minimum light intensity value $I_{ref\_min}$; setting a threshold intensity value at which a pinching occurs in the first pattern as a maximum light intensity value $I_{ref\_max}$; setting a range from the minimum light intensity value $I_{ref\_min}$ to the maximum light intensity value $I_{ref\_max}$ as the allowable range; and confirming whether a maximum light intensity value of the profile distribution of the pattern image for the extracted first pattern part exists within the allowable range.

A method for correcting a layout with a pitch change section according to second embodiment of the present invention may include preparing a pattern layout disposed to cause line-and-space type first patterns disposed at a first pitch and line-and-space type second patterns disposed at a second pitch different from the first pitch to be connected respectively in a pitch change section; obtaining a light intensity profile distribution data of a pattern image by performing a pattern transfer simulation on the pattern layout; extracting the light intensity profile distribution values for the first pattern at any one measuring point within the pitch change section and another reference point outside of the pitch change section from the light intensity profile distribution data of the pattern image; extracting a difference between the profile distribution at the measuring point and the profile distribution at the reference point; modifying the pattern layout by reducing a line width of a space part of the first pattern within the pitch change section to compensate the difference between the profile distributions; extracting the light intensity profile distribution of the pattern image for the first pattern part in which the line width is changed by performing a second pattern transfer simulation on the modified pattern layout; and determining whether an additional line-width correction of the first pattern part is performed or not by confirming whether the profile distribution of the pattern image for the extracted first pattern part exists within an allowable range of light intensity.

A method for correcting a layout with a pitch change section according to another embodiment of the present invention may include preparing a pattern layout disposed to cause line-and-space type first patterns disposed at a first pitch and line-and-space type second patterns disposed at a second pitch different from the first pitch to be connected respectively in a pitch change section; obtaining a light intensity profile distribution data of a pattern image by performing a pattern transfer simulation on the pattern layout; extracting the light intensity profile distribution values for the first pattern at any one measuring point within the pitch change section and another reference point outside of the pitch change section from the light intensity profile distribution data of the pattern image; extracting a difference between the profile distribution at the measuring point and the profile distribution at the reference point; modifying the pattern layout by separating the first pattern from the second pattern to compensate the difference between the profile distributions; extracting the light intensity profile distribution in the separated part by performing a second pattern transfer simulation on the modified pattern layout; and determining whether an additional line-width correction of the first pattern part is performed or not by confirming whether the profile distribution of the pattern image for the extracted first pattern part exists within an allowable range of light intensity.

DESCRIPTION OF SPECIFIC EMBODIMENTS

Hereinafter, a method for correcting a layout with a pitch change section in accordance with embodiments of the present invention will be described in detail with reference to the accompanying drawings.

Though a nonvolatile memory device is disposed with a line-and-space type layout, it has a pitch change section at which the pitch of the pattern is locally changed. As different diffraction information is overlapped in the pitch change section, a resolution is reduced and thus a failure is resulted. The method of modifying the layout using the optical proximity correction method to improve the failure caused due to the resolution reduction has a problem that a profile of the layout is complicated and thus it is not difficult to form a desired pattern. Therefore, it requires a method of correcting the layout so that an image profile distribution has a value consecutive to an adjoining area by controlling the pitch change section of the pattern.

Figure 1:
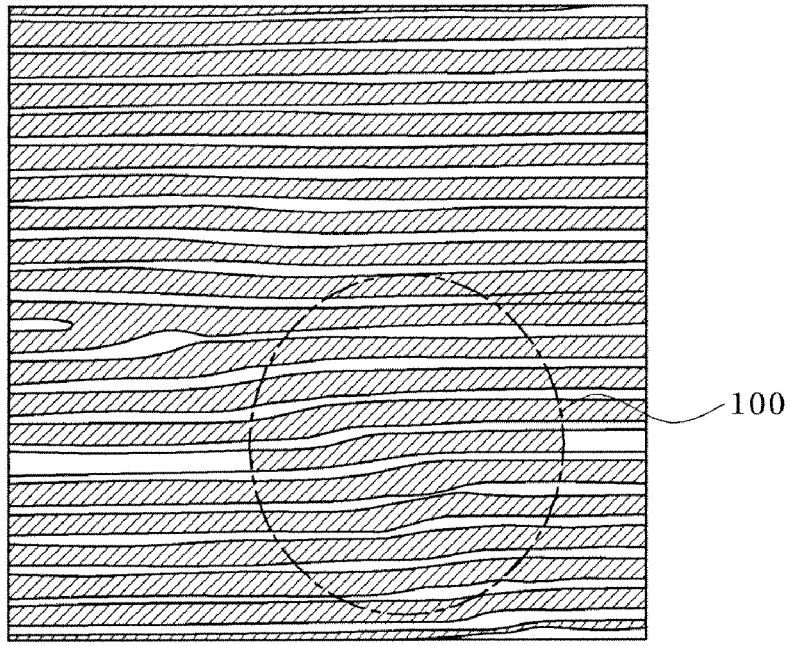
FIG. 1 and FIG. 2 are drawings illustrating a pitch change section of a pattern.
Figure 2:
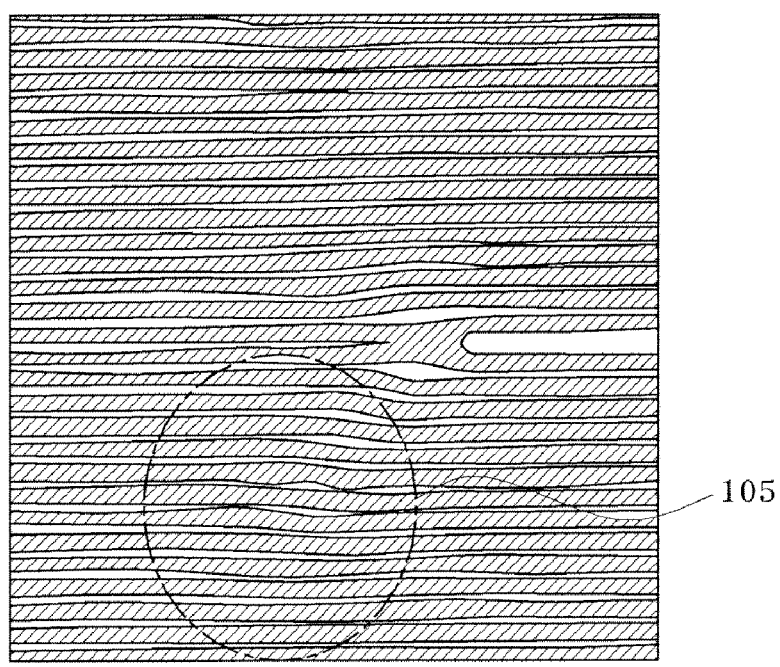
Figure 3A:
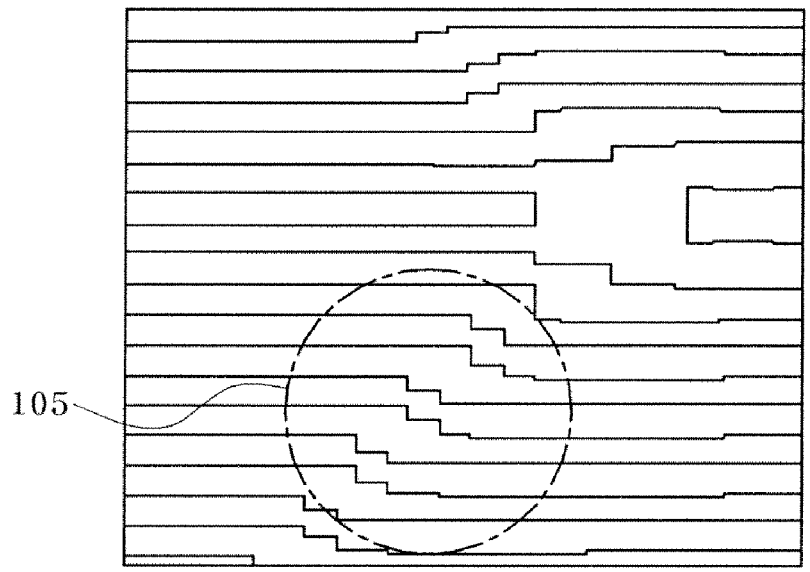
FIG. 3a and FIG. 3b are drawings showing a layout and a reticle in which the optical proximity correction is performed on the pitch change section of FIG. 2.
Figure 3B:
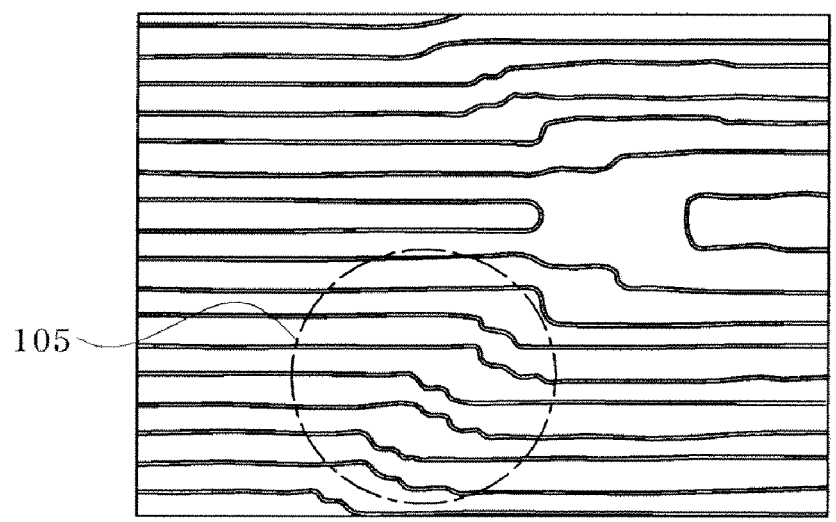
Figure 4:
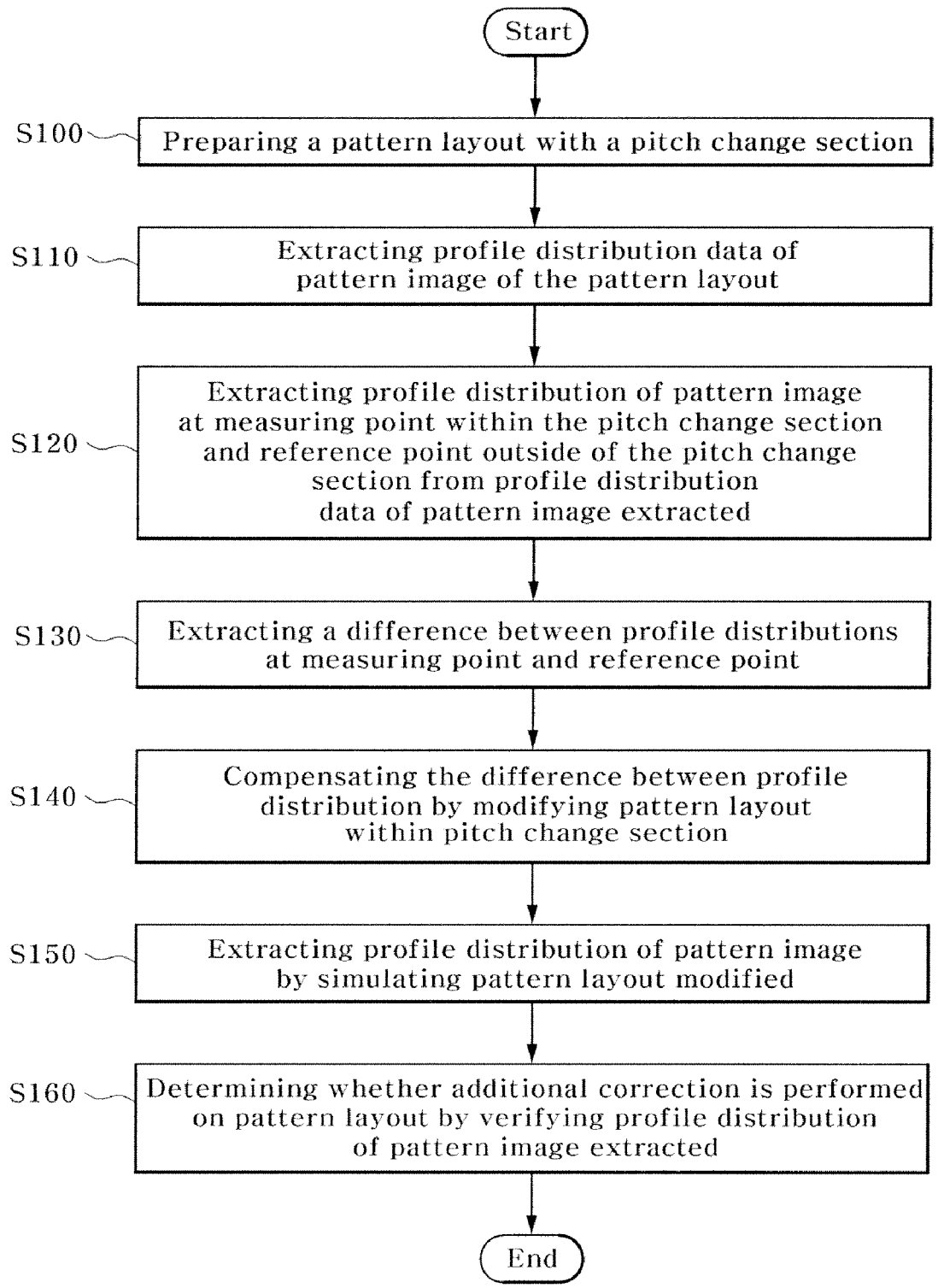
FIG. 4 is process flow diagram illustrating a method for correcting a layout with a pitch change section according to various embodiments of the present invention.

FIG. 4 is a process flow diagram illustrating a method of correcting the layout with the pitch change section according to an embodiment of the present invention. FIG. 5 to FIG. 20 are diagrams illustrating a method of correcting the layout with the pitch change section according to embodiments of the present invention.

Figure 5:
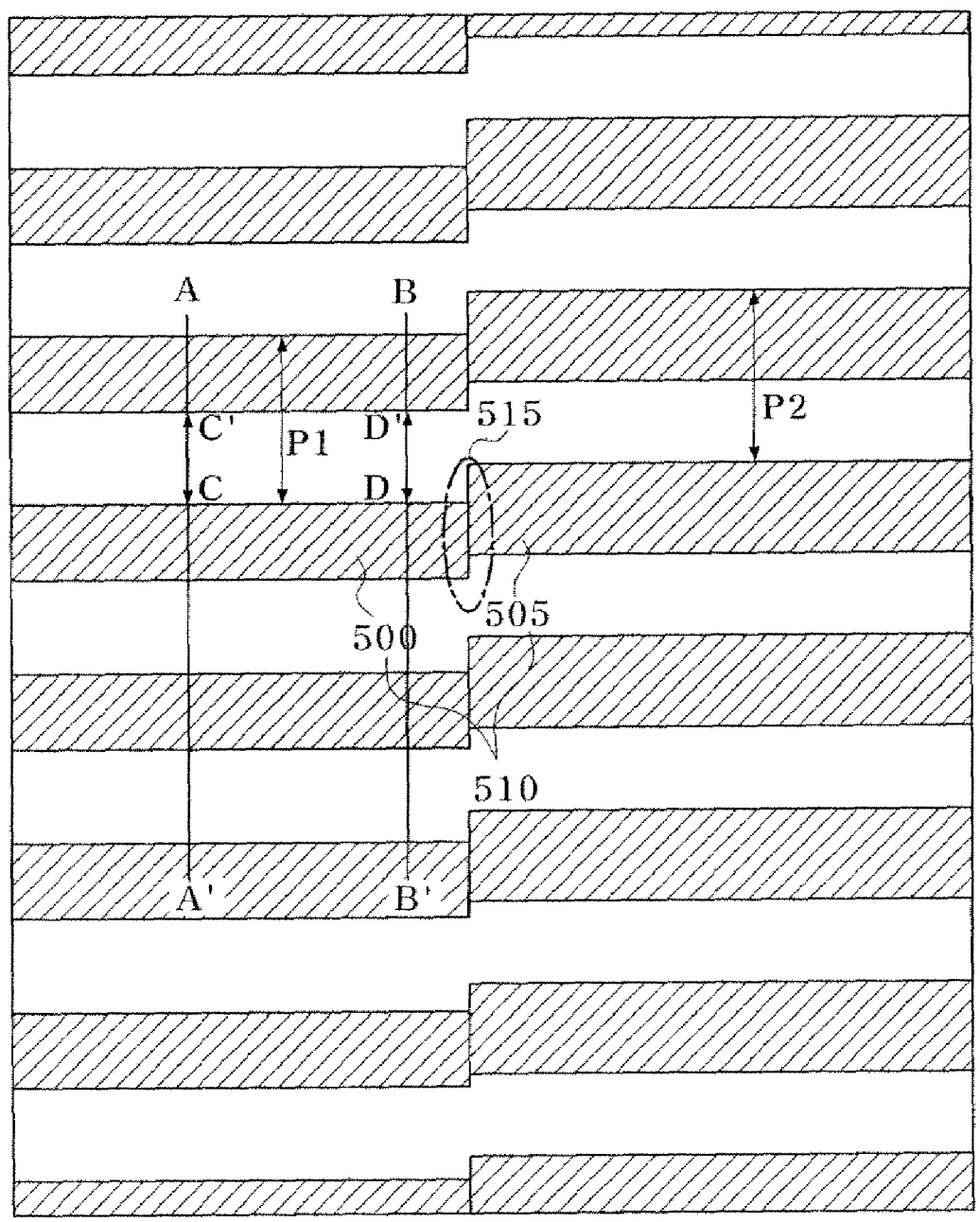
FIG. 5 to FIG. 20 are drawings illustrating a method for correcting a layout with a pitch change section according to various embodiments of the present invention.

Referring to FIG. 4 and FIG. 5, the pattern layout with the pitch change section is prepared S100. More specifically, referring to FIG. 5, a line-and-space type pattern layout 510 is disposed. Such pattern layout 510 consists of a first pattern 500 disposed at a first pitch P1 and a second pattern 505 disposed at a second pattern P2 different from the first pitch P1. The pitch is defined as a section including a line width of the pattern and a space distance in the pattern which is repetitively disposed. The first pattern 500 is designed to have the first pitch P1 of 120 nm and the second pattern 505 is designed to have the second pitch P2 of 124 nm relatively greater than the first pitch P1. Herein, the first pattern 500 and the second pattern 505 are disposed to be connected with each other in the pitch change section 515 of which the pitch is changed from 120 nm to 124 nm.

Then, a profile distribution data of the pattern image is obtained by performing the pattern transfer simulation on the pattern layout with the pitch change section 515. Herein, the profile distribution data of the pattern image can be obtained as the optic intensity profile distribution of the aerial image or the image profile distribution of a resist pattern, as a result of pattern transfer simulation. The illumination condition used for the pattern transfer simulation is 35 degrees of a dipole illumination system. Herein, the intensity profile distribution of the aerial image is defined as an intensity distribution of the light formed by transmitting the photo mask from the light source of the exposure apparatus.

Then, the profile distributions of the pattern image for the first pattern 500 at any one measuring point within the pitch change section and another reference point outside of the pitch change section are extracted from the profile distribution data of the pattern image S120.

Referring to FIG. 5, a section A-A' and a section B-B' are areas having a first pattern 500 disposed at a first pitch P1 among the first pattern 500 and the second pattern 505. Herein, the section A-A' is separated from the pitch change section 515 not to be influenced by a diffraction due to the second pattern 505. The reference point is preferably positioned in the first pattern part while being not influenced by the diffraction of the exposure light source due to the second pattern 505. Further, it is preferably set as a point separated by a distance of at least 5 times a size of the pitch from the pitch change section while being in an area of a smaller pitch among the first pattern 500 and the second pattern 505. Consequently, a section C-C' of the section A'A' is set as a reference point. Further, the section B-B' is adjacent to the pitch change section 515 and influenced by all the diffraction information of the first pattern 500 and the second pattern 505. Subsequently, since the contrast is most deteriorated in the section B-B' influenced by all the diffraction information of the first pattern 500 and the second pattern 505, the patterning is fully not performed. Therefore, a section D-D' of the section B-B' is set as a measuring point. Then, the profile distributions of the pattern image for the first pattern 500 at the measuring point and the reference point are extracted and the difference between profile distributions at the measuring point and the reference point is extracted S130.

Figure 6:
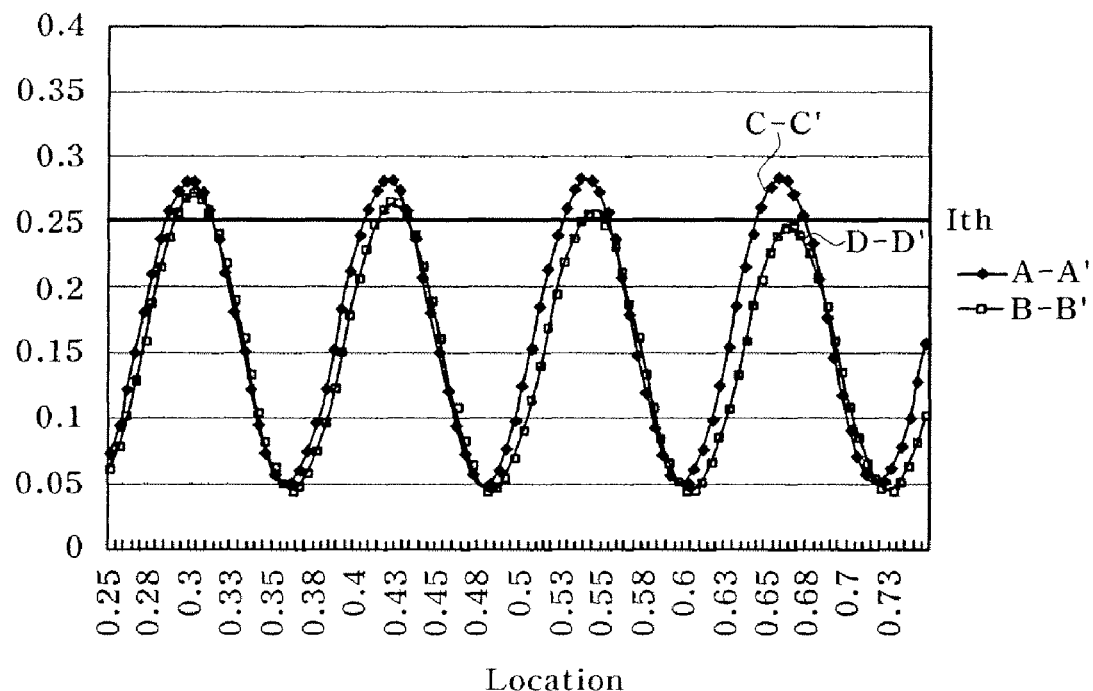
Figure 7:
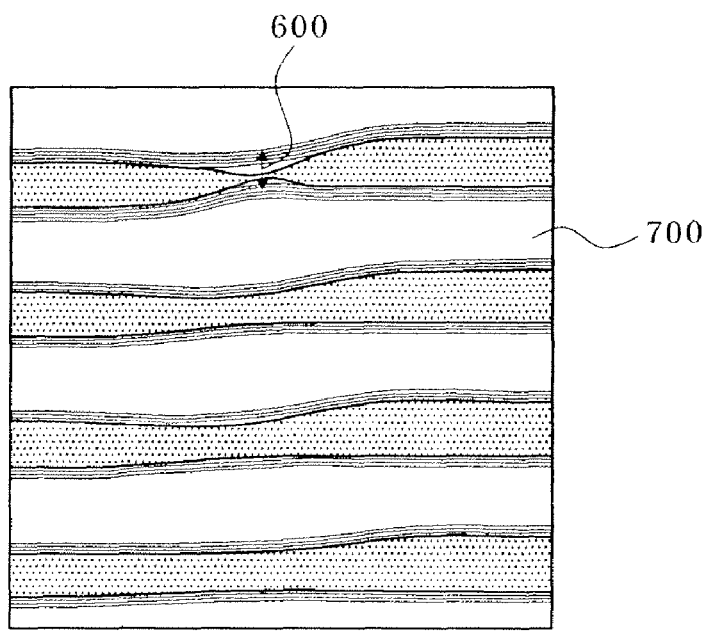

FIG. 6 is a graph showing the light intensity profile distribution of the aerial image of the pattern layout including the section A-A' and the section B-B' of FIG. 5. Referring to FIG. 6, a threshold light intensity of the reference value at which the desired pattern is formed is defined as Ith. The threshold light intensity value is 0.25 in a case of the embodiment of the present invention. The resist film is removed through a development to form the desired pattern if the light intensity is greater than the threshold light intensity and the resist film is not removed if the light intensity is less than the threshold light intensity. Therefore, since the section C-C' of the section A-A' which is not influenced by the diffraction of the second pattern 505 has an intensity greater than the threshold light intensity Ith, the pattern can be normally formed. Since the section D-D' of the section B-B' influenced by the pitch change section 515 has a value less than the threshold light intensity, the resist film can not satisfactorily be removed. FIG. 7 is a drawing showing a profile distribution of the image for the resist pattern in a state that the layout is not modified.

Referring to FIG. 7, since the resist film is satisfactorily not removed in the pitch change section 600, it will be appreciated to cause a bridge defect that an adjacent resist 700 is to be connected. In order to prevent such bridge defect, it is preferable to control the section D-D' having the value less than the threshold light intensity Ith to have a value greater than the threshold intensity value. Such light intensity value can be controlled by controlling the profile of the pattern layout.

A difference between the profile distributions is compensated by modifying the pattern layout within the pitch change section S140. Specifically, the pattern layout is modified by adding or subtracting the line width of the space part of the area of smaller pitch, e.g., the first pattern 500 within the pitch change section 515 (FIG. 5). The pattern layout compensates the difference between the profile distributions by modifying the layout in a horizontal direction to a direction in which the first pattern 500 is disposed or by modifying the layout in a vertical direction to a direction in which the first pattern 500 is disposed. The pattern layout can be modified in a manner of chopping or adding the layout of the pitch change section 515 (FIG. 5) in a polygon shape. The present invention provides a method of modifying the pattern layout by chopping the line width of the space part of the first pattern 500 using a preferable process.

Figure 8:
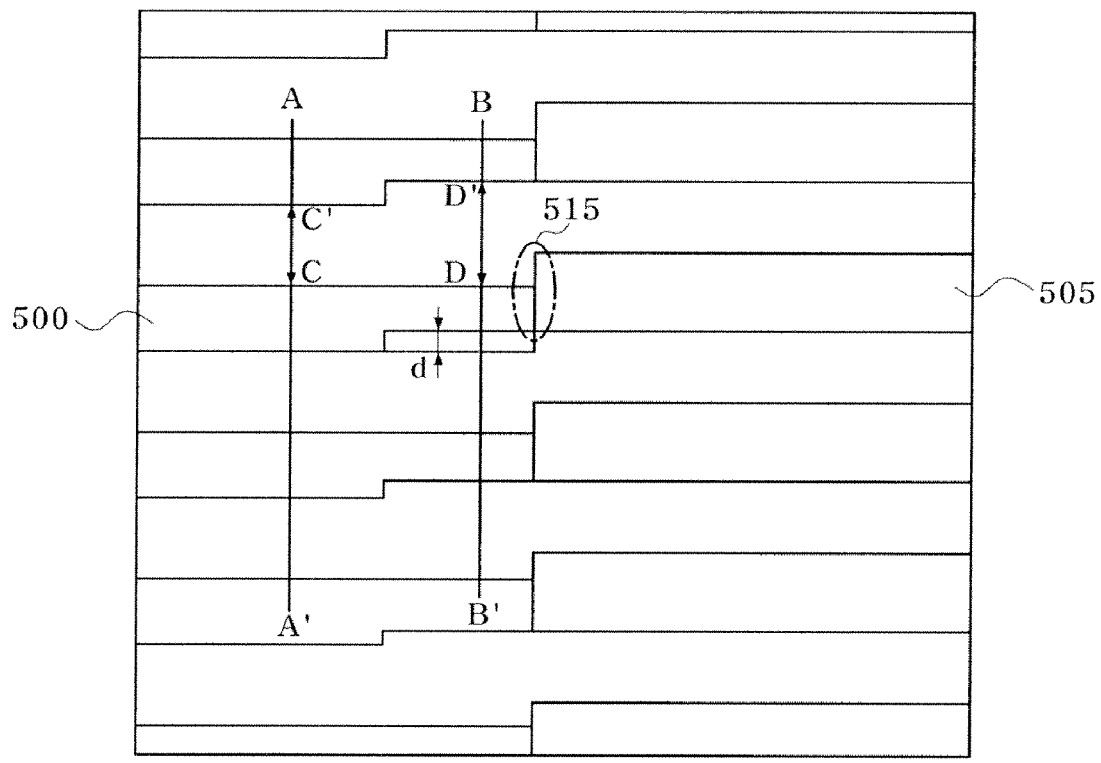
Figure 9:
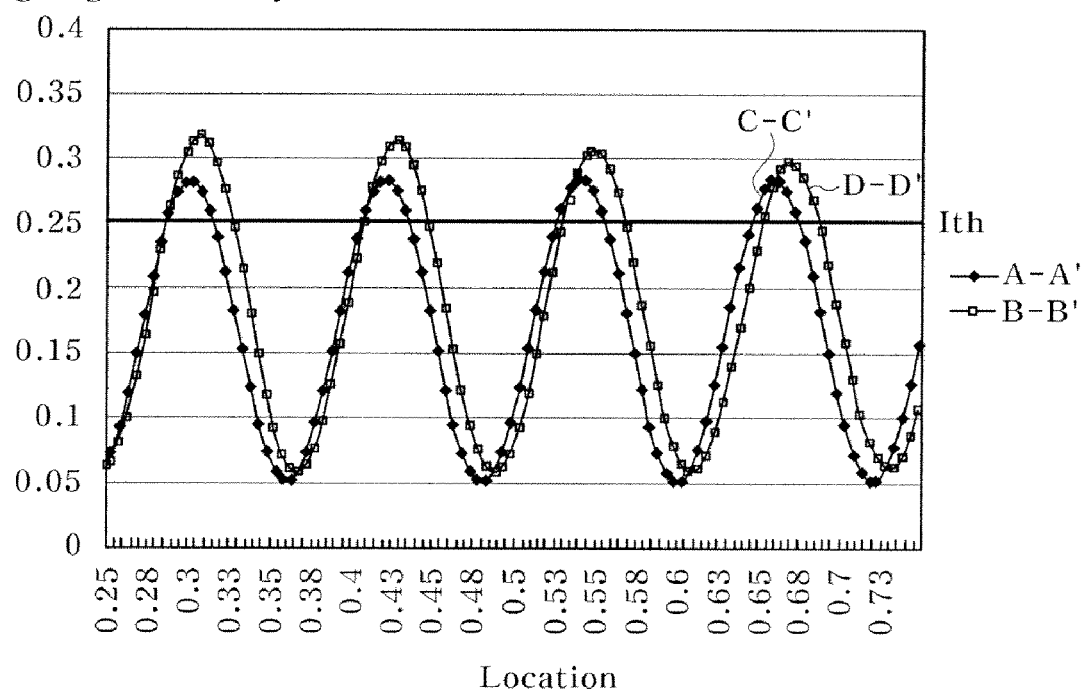
Figure 10:
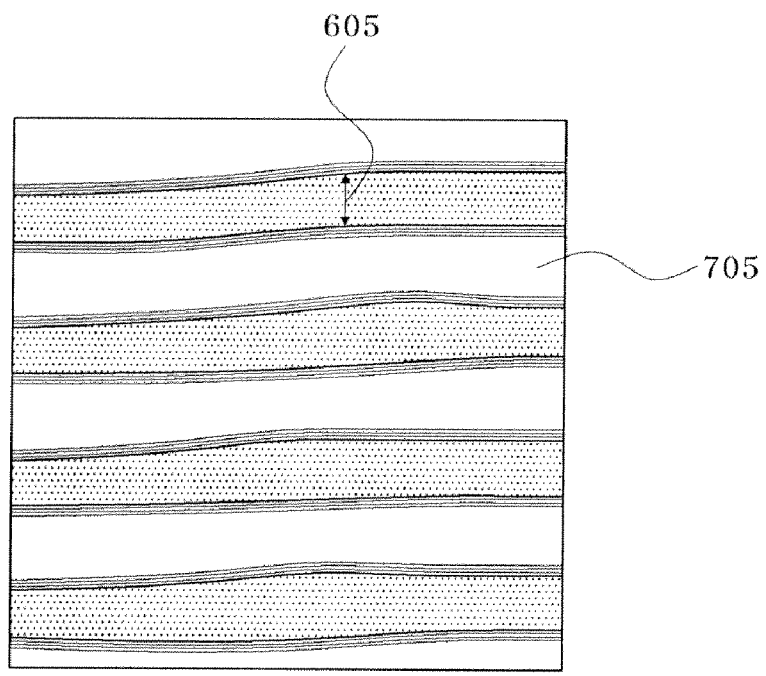

Referring to FIG. 5 and FIG. 8, the line width of the space part of the first pattern 500 disposed at the first pitch P1 is chopped by a prescribed thickness (d in FIG. 8) in a polygon shape in a direction horizontal to a direction in which the first pattern 500 is disposed. Then, the light intensity distribution of the aerial image is measured by performing the simulation operation on the section including the boundary area 515 in which the pitch is changed. Here, the portion of which the layout of the first pattern 500 is chopped is a layout of the section D-D' adjacent to the pitch change section 515. Referring to FIG. 9 which is a graph showing the light intensity profile distribution of the aerial image, it will be appreciated that all of the section C-C' and the section D-D' have a value greater than the threshold light intensity value if the threshold light intensity is 0.25. Subsequently, it is possible to normally form the desired pattern with a modified layout. Referring to FIG. 10 illustrating the profile distribution of the resist pattern image of the modified layout, it will be appreciated that a width 605 of sufficient distance is ensured between the resist 705 and the resist 705. In other words, if a height of the light intensity profile distribution of the aerial image at the measuring point (section D-D') is lower than a height of the profile distribution at the reference point (section C-C'), the line part of the first pattern 500 is partially chopped in a polygon shape so that the line width of the space part of the first pattern 500 is increased, thereby controlling the intensity of the image. It is possible to form the desired pattern by controlling the line width profile of the pattern layout to control the image intensity distribution value. Meanwhile, it is necessary to confirm whether the correction is satisfactorily performed since the light intensity value is changed in accordance with a correction degree of the pattern layout.

Figure 11:
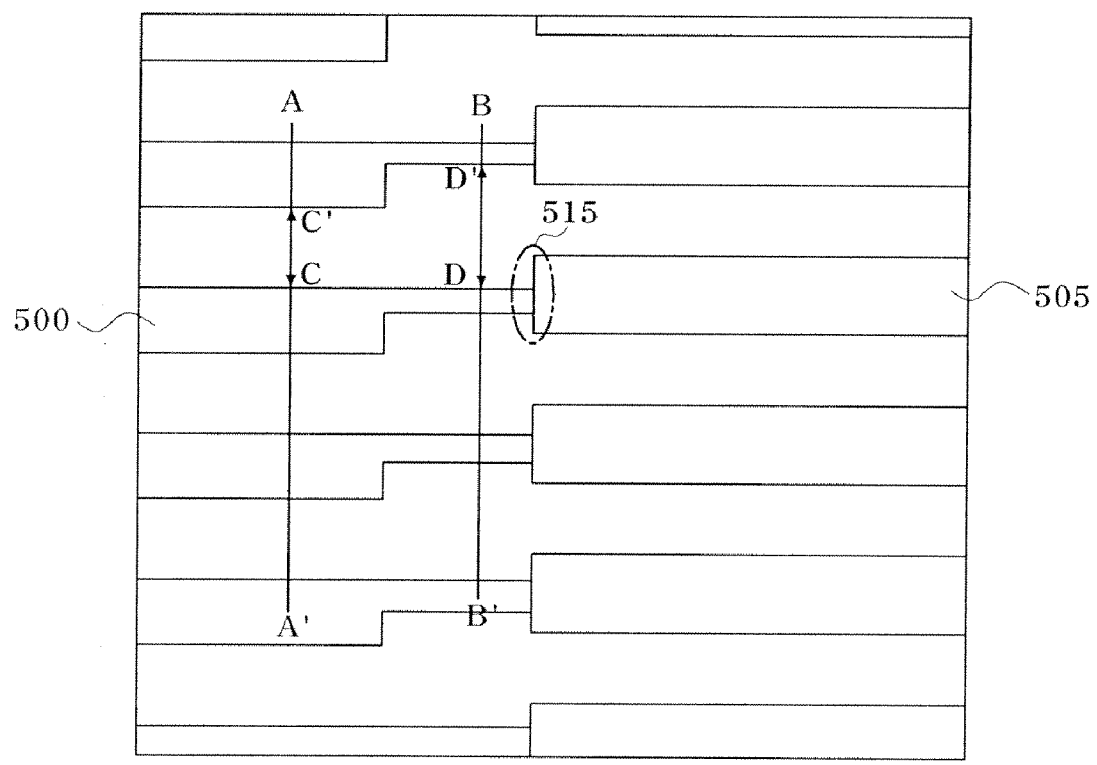
Figure 12:
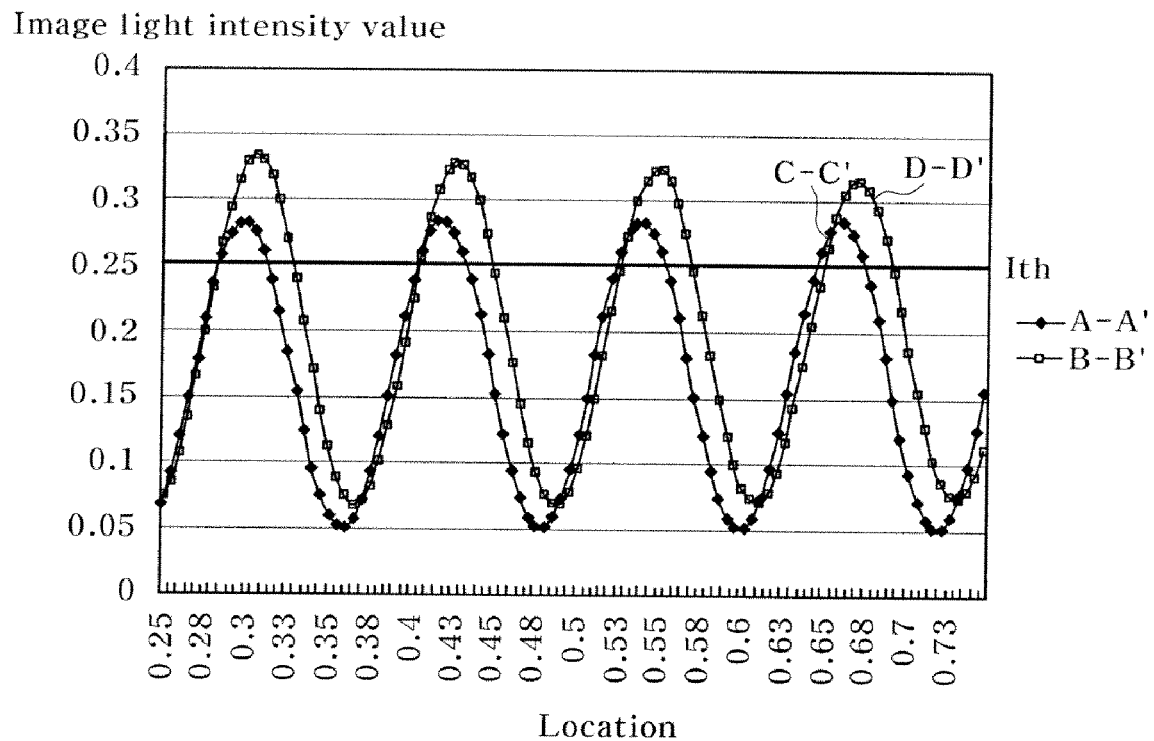
Figure 13:
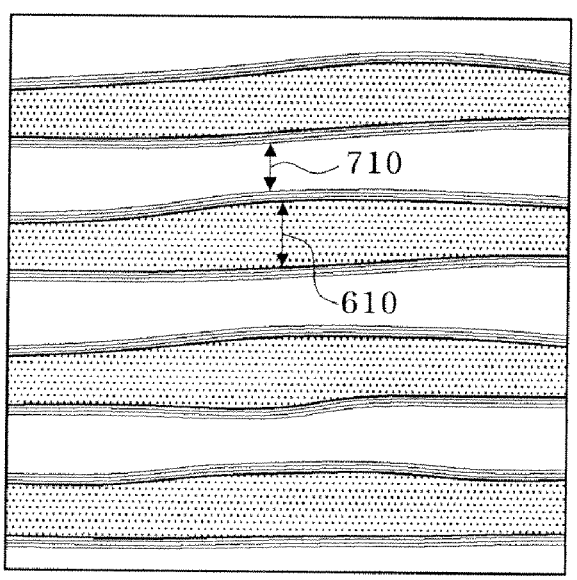
Figure 14:
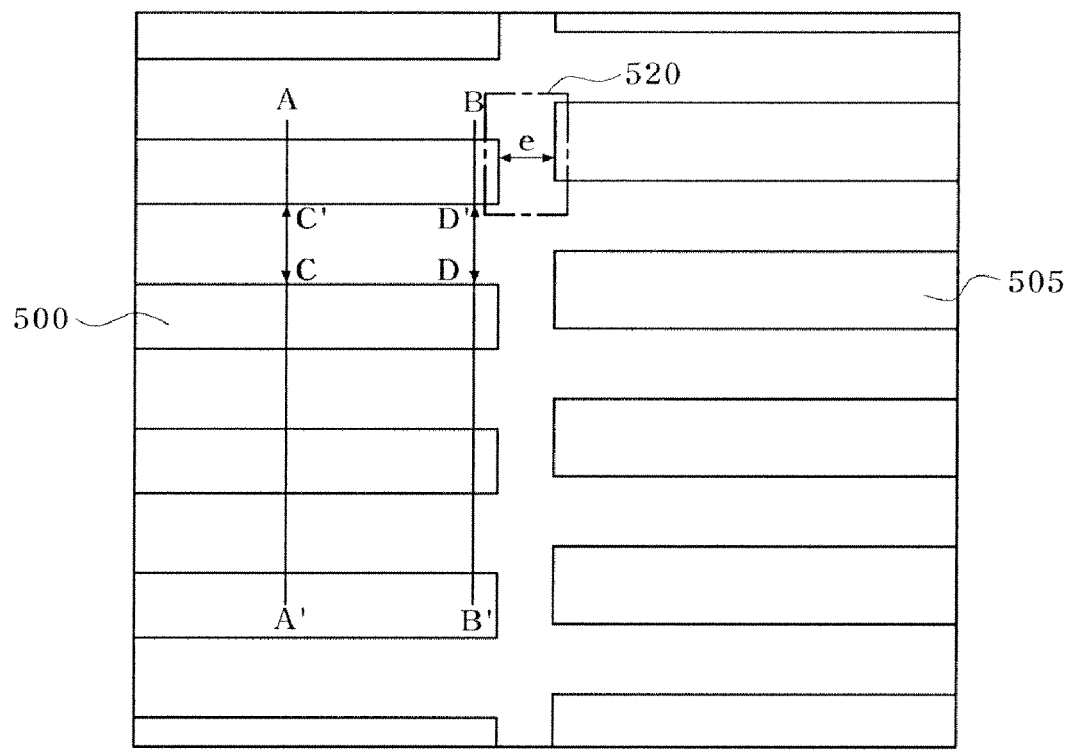

Consequently, the image intensity at the area of which the pitch is controlled is compared with the image intensity at the reference area to confirm whether the correction of the layout is satisfactorily performed. For the purpose of it, the profile distribution of the pattern image is extracted by performing the simulation operation on the modified pattern layout S150. The reference point of the light intensity is set to be separated by a distance of 5 times the size of the pitch from the pitch change section while being in an area of smaller pitch among the first pattern 500 and the second pattern 505. In such an embodiment of the present invention, the correction operation of the pattern layout is performed based on the light intensity distribution in the section C-C' of the reference point. Referring to FIG. 11 and FIG. 12, if correcting the pattern layout by excessively chopping the pattern layout of the first pattern 500, the light intensity value at the measuring point D-D' is excessively increased as compared with that of the reference section C-C' and at the same time the width of the pattern is thinned. As shown in FIG. 13, if the width of the pattern 710 is thinned, a space between the pattern and the pattern can be increased and thus a pinching defect of the pattern can be caused due to broadening of a space of the section 610 indicated by an arrow.

It is determined whether an additional correction of the pattern layout is performed or not by verifying the profile distribution of the pattern image which is extracted S160. In accordance with the determination of whether the additional correction of the pattern layout is performed, a threshold light intensity value at which the bridge is caused to be generated at the first pattern 500 is set as a minimum light intensity value $I_{ref\_min}$ and a threshold light intensity value at which the pinching is caused to be generated at the first pattern 500 is set as a maximum light intensity value $I_{ref\_max}$. Then, a range from the minimum light intensity value $I_{ref\_max}$ to the maximum light intensity value $I_{ref\_max}$ is set as a correction allowable range. It is confirmed whether the maximum light intensity value of the pattern image profile distribution of the first pattern 500 exists within the correction allowable range. That is, the correction operation is processed to be at least the minimum light intensity value $I_{ref\_min}$ capable of preventing the minimum bridge and up to the maximum light intensity value $I_{ref\_max}$ capable of preventing the pinching. Therefore, the correction operation of the pattern layout is performed based on the light intensity value distribution at the reference point (section C-C'). As such, the correction operation of the pattern layout is completed if the light intensity value exists within the predetermined correction allowable range by comparing the image profile distribution at the correction section with the image profile distribution at the reference point. The pattern layout can be automatically changed by applying such algorithm even in other pitch change section.

Meanwhile, it is possible to overcome a problem of reducing the contrast in the pitch change section in such a manner that the line width of the pattern layout is chopped. However, a mask error can occur as a step-like layout is formed with chopping or adding in the polygon shape during the correction operation of the pattern layout. Consequently, the layout is simplified by removing the pattern layout of the pitch change section by a prescribed distance in order to improve the mask error. The illumination system used for forming the line-and-space pattern is a dipole illumination system. Consequently, it is possible to implement the connected pattern on the wafer by inducing the interference phenomenon between the patterns even in a short circuit condition on the pattern layout. Specifically, referring to FIG. 14 to FIG. 16, a space is disposed by chopping the pitch change section 520 between the first pattern 500 and the second pattern 505 by a prescribed width e. In other words, if a height of the light intensity profile distribution of the aerial image at the measuring point (section D-D') is lower than a height of the profile distribution at the reference point (section C-C'), a line part of the first pattern 500 connected to a line part of the second pattern 505 is chopped, in order to be separated from the line part of the second pattern 505.

Figure 15:
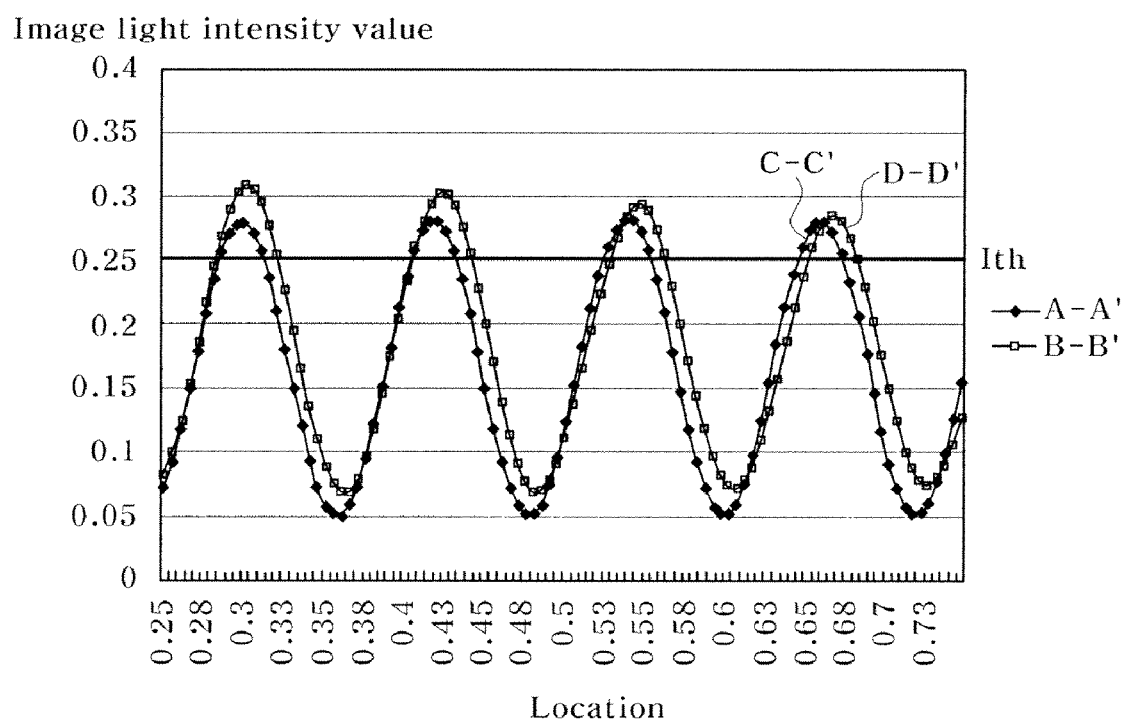
Figure 16:
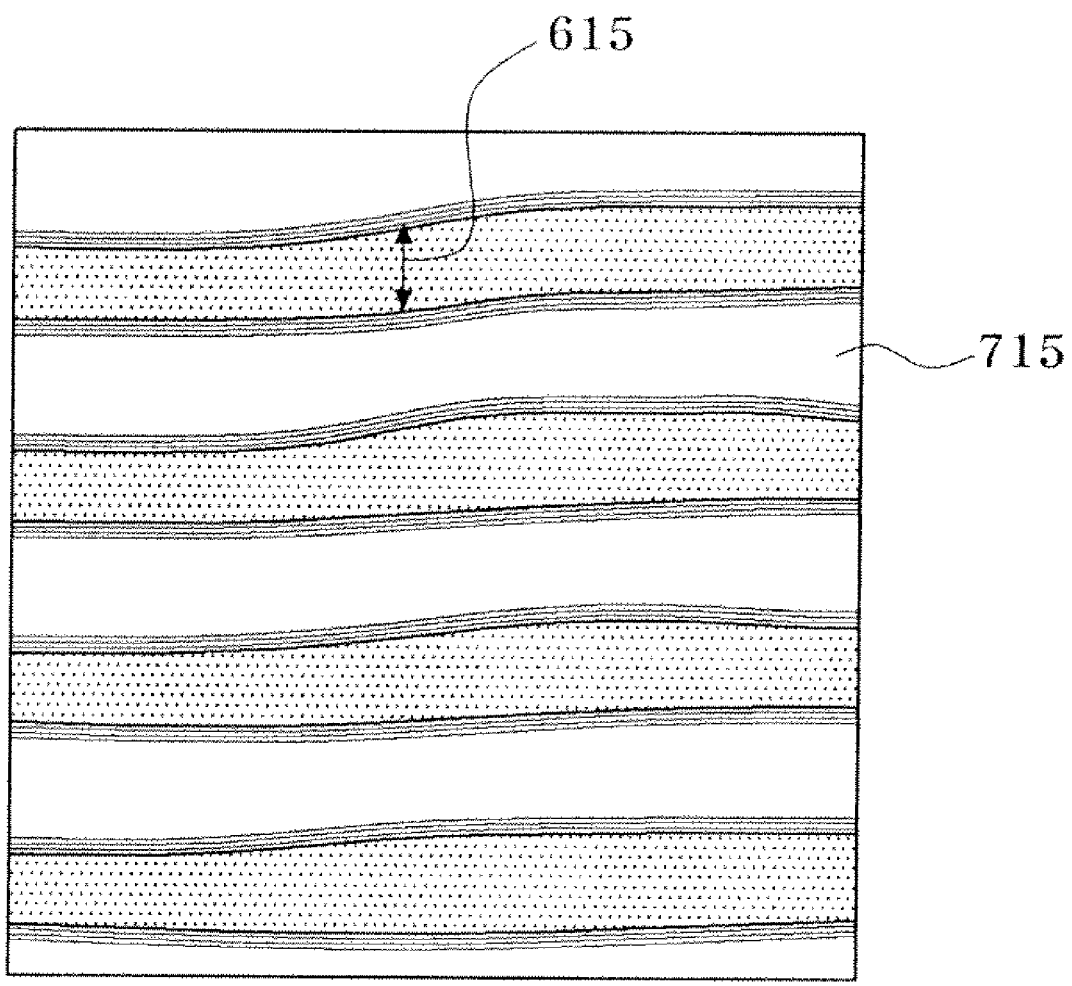
Figure 17A:
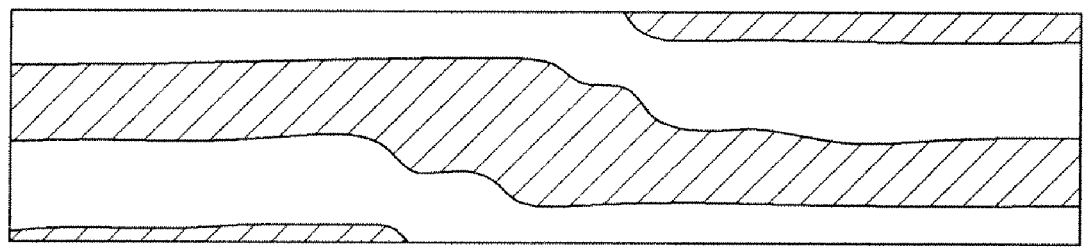
Figure 17B:
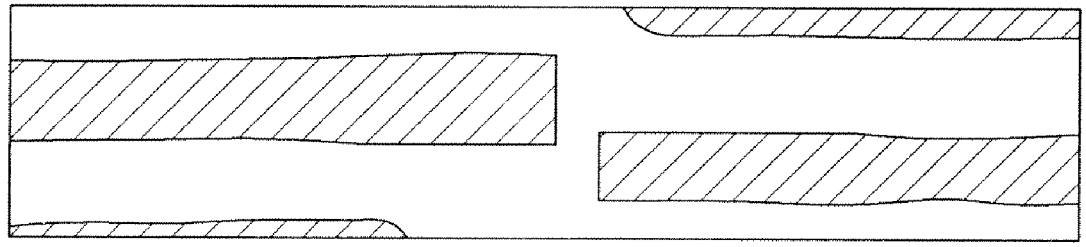

Referring to FIG. 15 showing the light intensity profile distribution of the aerial image of the modified pattern layout, it can be appreciated that the light intensity of the section C-C' and the light intensity of the section D-D' are equally generated. Further, if the threshold intensity value Ith is 0.25, it will be appreciated that the section C-C' and the section D-D' have a value greater than the threshold light intensity value. Consequently, as shown in FIG. 16, it is possible to implement the pattern in which the space 615 is sufficiently ensured between the pattern 715 and the pattern 715. The correction method of disposing the space by removing the line part of the pattern layout has a large advantage that can minimize the mask error resulted from the complicated step-like layout. Referring to FIG. 17a and FIG. 17b, although it is difficult to form the desired pattern due to the mask error upon forming the pattern on actual mask in a case of the complicated step-like mask layout (FIG. 17a), it is possible to implement the desired pattern in a case of forming the pattern on the mask as a simplified layout (FIG. 17b).

Figure 18:
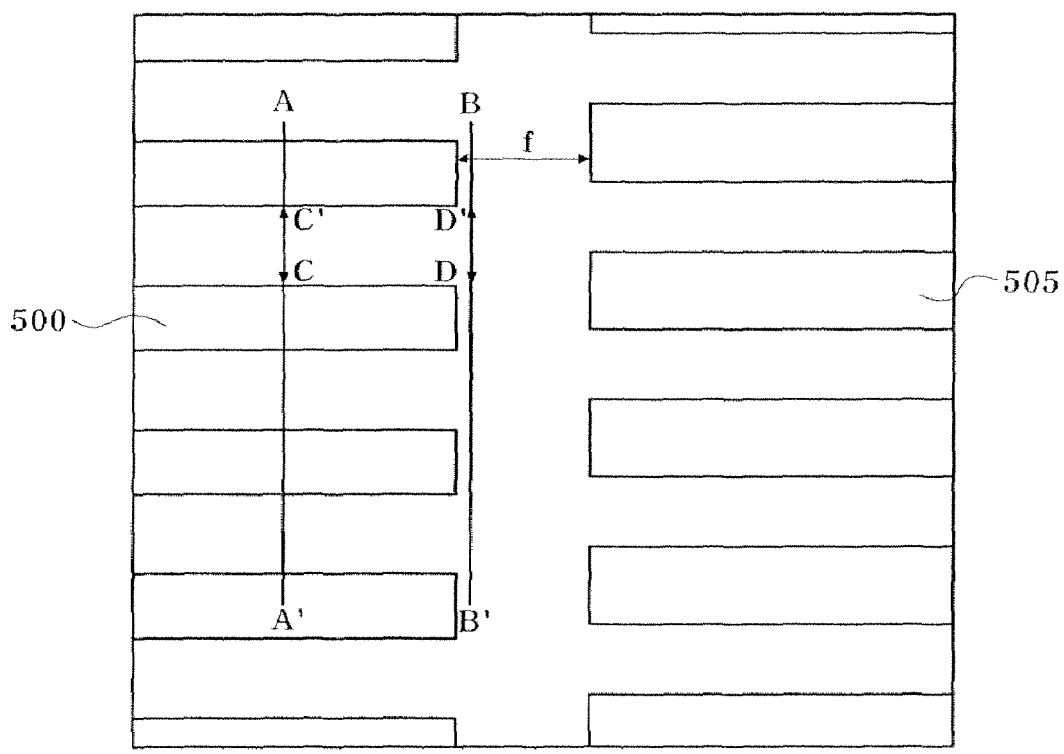
Figure 19:
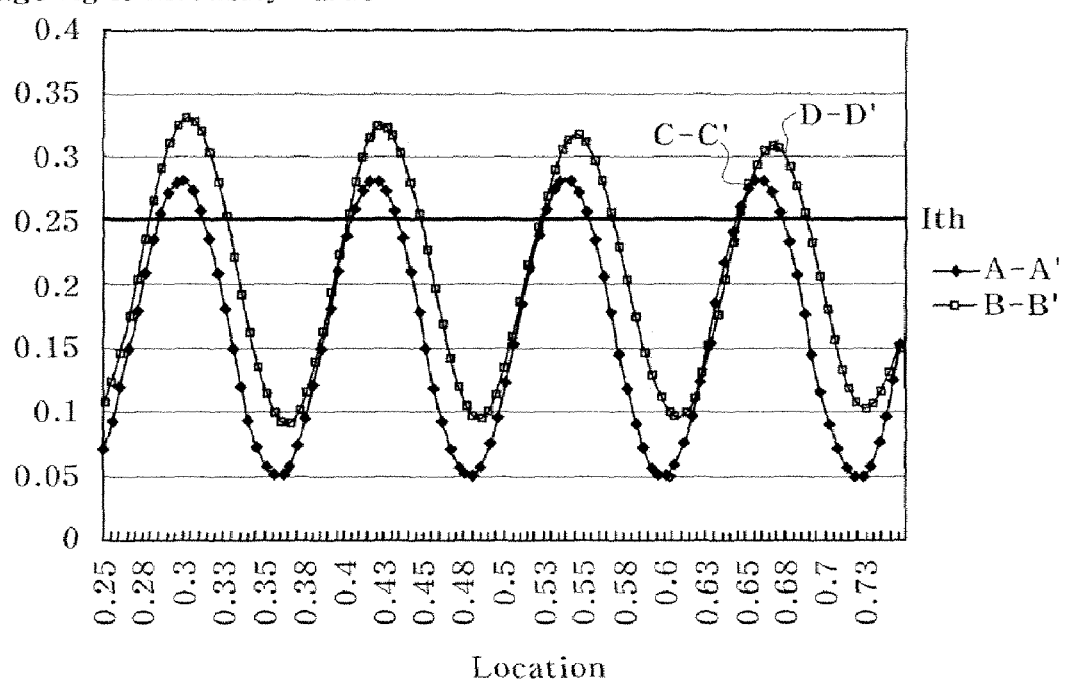
Figure 20:
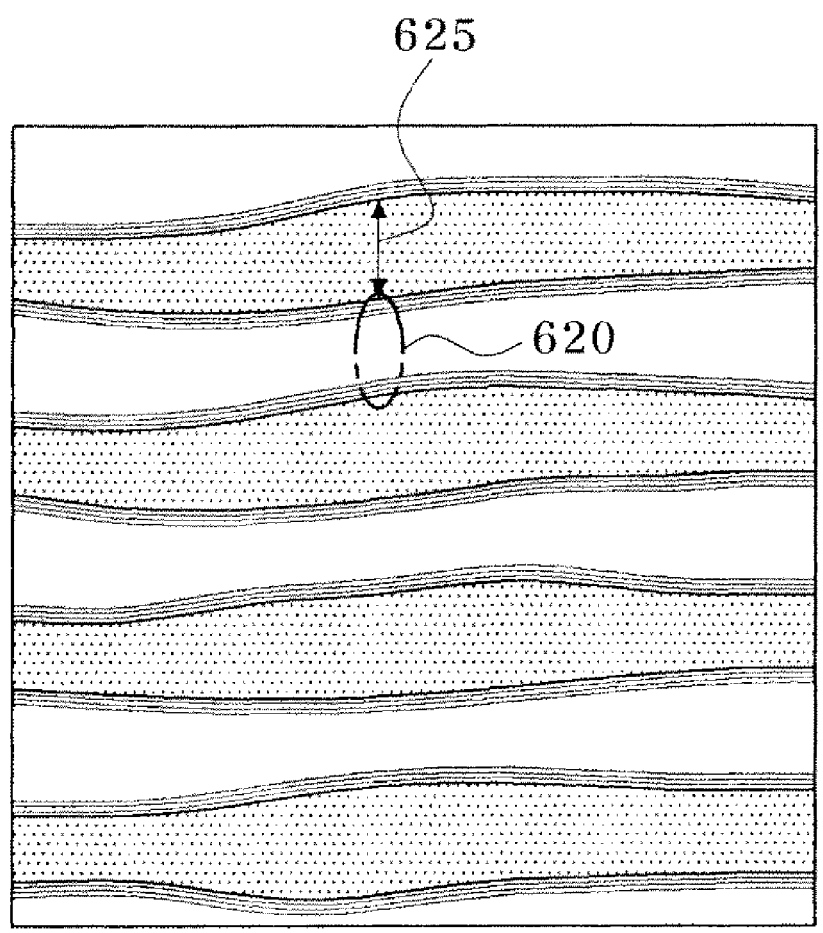

Meanwhile, a method of removing and correcting the layout on the pitch change section can cause a pinching defect, as shown in FIG. 18 to FIG. 20. Specifically, a space f may be excessively widened between the first pattern 500 and the second pattern 505 by removing excessively the line of the pattern layout. Then, as shown in FIG. 19, the light intensity value of the section D-D' becomes excessively larger as compared with the section C-C'. Subsequently, as the space between the pattern and the pattern is widened so that the space of the section 625 indicated by an arrow in FIG. 20 is extended, the thinning phenomenon 620 of the pattern can be caused and thus the pinching defect can result. Therefore, the correction method of making short the layout must be also based on the light intensity value distribution. The threshold light intensity value at which the bridge is caused to occur in the first pattern 500 is set as a minimum light intensity value $I_{ref\_min}$ and the threshold light intensity value at which the pinching is caused to occur in the first pattern 500 is set as a maximum light intensity value $I_{ref\_max}$. Then, a range from the minimum light intensity value $I_{ref\_max}$ to the maximum light intensity value Iref_max is set as a correction allowable range. It will be appreciated that the maximum light intensity value of the pattern image profile distribution of the first pattern 500 exists within the correction allowable range. That is, the correction is processed so that the light intensity is allowed to be at least the minimum light intensity value $I_{ref\_min}$ capable of preventing the minimum bridge and up to the maximum light intensity value $I_{ref\_max}$ capable of preventing the pinching. Then, the pattern layout correction is completed if the light intensity value exists within the predetermined allowable correction range by comparing the image profile distribution in the corrected section with the image profile distribution in the reference point.

The method for correcting the layout with the pitch change section according to the present invention can allow the light intensity profile distribution to exist within the allowable correction range by computing the aerial image in the pitch change section and automatically change the layout to have a value consecutive to the adjacent area. Consequently, the image contrast can be prevented from being deteriorated in the pitch change section and the automatic algorithm can substitute the manual operation requiring much times and efforts. Further, it is possible to minimize the mask error problem by simplifying the complicated layout.

While the present invention has been described with respect to the specific embodiments, it will be apparent to those skilled in the art that various changes and modifications may be made without departing from the spirit and scope of the invention as defined in the following claims.

What is claimed is:

1. A method for correcting a layout with a pitch change section, comprising:

preparing a pattern layout disposed to cause line-and-space type first patterns disposed at a first pitch and line-and-space type second patterns disposed at a second pitch to be connected respectively in a pitch change section;

obtaining a profile distribution data of a pattern image by performing a pattern transfer simulation on the pattern layout by using a computer;

extracting the profile distribution of the pattern image for the first pattern at any one measuring point within the pitch change section and another reference point outside of the pitch change section from the profile distribution data of the pattern image by using a computer;

extracting a difference between the profile distribution at the measuring point and the profile distribution at the reference point;

modifying the pattern layout by adding and reducing a line width of a space part of the first pattern within the pitch change section to compensate the difference between the profile distributions;

extracting the profile distribution of the pattern image for the first pattern part in which the line width is changed by performing a second pattern transfer simulation on the modified pattern layout by using a computer; and determining whether an additional line-width correction of the first pattern part is performed or not by confirming whether the profile distribution of the pattern image for the extracted first pattern part exists within an allowable range.

2. The method of claim 1, wherein the reference point is set to be located in the first pattern part of a point separated from the second pattern not to be influenced by diffraction phenomenon of an exposure light source due to the second pattern.

3. The method of claim 2, wherein the reference point is set as a point separated by at least 5 times a size of the pitch from the pitch change section while being in an area of smaller pitch among the first pattern and the second pattern.

4. The method of claim 1, wherein the profile distribution data of the pattern image includes a pitch change section obtained from the profile distribution of the image for the resist pattern as a simulation result of the pattern transfer.

5. The method of claim 1, wherein the profile distribution data of the pattern image includes a pitch change section obtained from the intensity profile distribution of an aerial image as a simulation result of the pattern transfer.

6. The method of claim 5, wherein the modifying the pattern layout comprises:

partially chopping the line part of the first pattern in a polygon shape to cause a line width of a space part of the first pattern to be increased if a height of the intensity profile distribution of the aerial image at the measuring point is lower than a height of the profile distribution at the reference point; and adding the line part of the first pattern in the polygon shape to cause the line width of the space part of the first pattern to be reduced if a height of the intensity profile distribution of the aerial image at the measuring point is greater than a height of the profile distribution at the reference point.

7. The method of claim 1, wherein the modifying a pitch of the layout comprises:

chopping the line part of the first pattern connected to the line part of the second pattern to be separated from the line part of the second pattern if a height of the intensity profile distribution of the aerial image at the measuring point is lower than a height of the profile distribution at the reference point.

8. The method of claim 1, wherein the determining whether the additional line-width correction of the first pattern part is performed or not comprises:

setting a threshold intensity value at which a bridge occurs in the first pattern as a minimum light intensity value $I_{ref\_min}$;

setting a threshold intensity value at which a pinching occurs in the first pattern as a maximum light intensity value $I_{ref\_max}$;

setting a range from the minimum light intensity value $I_{ref\_min}$ to the maximum light intensity value $I_{ref\_max}$ as the allowable range; and confirming whether a maximum light intensity value of the profile distribution of the pattern image for the extracted first pattern part exists within the allowable range.

9. A method for correcting a layout with a pitch change section, comprising:

preparing a pattern layout disposed to cause line-and-space type first patterns disposed at a first pitch and line-and-space type second patterns disposed at a second pitch different from the first pitch to be connected respectively in a pitch change section;

obtaining a light intensity profile distribution data of a pattern image by performing a pattern transfer simulation on the pattern layout by using a computer;

extracting the light intensity profile distribution values for the first pattern at any one measuring point within the pitch change section and another reference point outside of the pitch change section from the light intensity profile distribution data of the pattern image by using a computer;

extracting a difference between the profile distribution at the measuring point and the profile distribution at the reference point;

modifying the pattern layout by reducing a line width of a space part of the first pattern within the pitch change section to compensate the difference between the profile distributions;

extracting the light intensity profile distribution of the pattern image for the first pattern part in which the line width is changed by performing a second pattern transfer simulation on the modified pattern layout by using a computer; and determining whether an additional line-width correction of the first pattern part is performed or not by confirming whether the profile distribution of the pattern image for the extracted first pattern part exists within an allowable range of light intensity.

10. A method for correcting a layout with a pitch change section, comprising:

preparing a pattern layout disposed to cause line-and-space type first patterns disposed at a first pitch and line-and-space type second patterns disposed at a second pitch different from the first pitch to be connected respectively in a pitch change section;

obtaining a light intensity profile distribution data of a pattern image by performing a pattern transfer simulation on the pattern layout by using a computer;

extracting the light intensity profile distribution values for the first pattern at any one measuring point within the pitch change section and another reference point outside of the pitch change section from the light intensity profile distribution data of the pattern image by using a computer;

extracting a difference between the profile distribution at the measuring point and the profile distribution at the reference point;

modifying the pattern layout by separating the first pattern from the second pattern to compensate the difference between the profile distributions;

extracting the light intensity profile distribution in the separated part by performing a second pattern transfer simulation on the modified pattern layout by using a computer; and determining whether an additional line-width correction of the first pattern part is performed or not by confirming whether the profile distribution of the pattern image for the extracted first pattern part exists within an allowable range of light intensity.

* * * * *